United States Patent
Boness et al.

(10) Patent No.: US 6,548,378 B1
(45) Date of Patent: Apr. 15, 2003

(54) METHOD OF BORON DOPING WAFERS USING A VERTICAL OVEN SYSTEM

(75) Inventors: Henning Boness, Itzehoe (DE); Patrick Press, Kiel (DE)

(73) Assignee: Vishay Semiconductor Itzehoe GmbH, Itzehoe (DE)

( * ) Notice: Subject to any disclaimer, the term of this patent is extended or adjusted under 35 U.S.C. 154(b) by 0 days.

(21) Appl. No.: 09/868,324

(22) PCT Filed: Dec. 16, 1999

(86) PCT No.: PCT/DE99/04035

§ 371 (c)(1),
(2), (4) Date: Aug. 30, 2001

(87) PCT Pub. No.: WO00/39840

PCT Pub. Date: Jul. 6, 2000

(30) Foreign Application Priority Data

Dec. 17, 1998 (DE) .......................................... 198 58 351
Nov. 10, 1999 (DE) .......................................... 199 54 021

(51) Int. Cl.$^7$ ............................................. H01L 21/26
(52) U.S. Cl. ..................... 438/478; 438/558; 438/795
(58) Field of Search .......................... 427/248.1, 255.5; 438/478, 479, 758, 760, 795, 493, 495, 505, 914, 542, 549, 558, 565

(56) References Cited

U.S. PATENT DOCUMENTS

| 5,217,560 A | | 6/1993 | Kurono et al. |
| 5,387,557 A | * | 2/1995 | Takagi |
| 5,418,184 A | * | 5/1995 | Girissch |
| 5,674,777 A | * | 10/1997 | Chen et al. |
| 5,753,530 A | * | 5/1998 | Akamine et al. |

FOREIGN PATENT DOCUMENTS

| EP | 0438677 | 7/1991 |
| EP | 0538874 | 4/1993 |
| EP | 0736614 | 10/1996 |

OTHER PUBLICATIONS

P. C. Parekh et al., "The Influence of Reaction Kinetics Between $BBr_3$ and $O_2$ on the Uniformity Base Diffusion", *Proceeding of the IEEE*, Sep. 1969, vol. 57, No. 9, USA.

J. Monkowski and J. Stach, "System Characterization of Planar Source Diffusion", Solid State Technology, pp. 38–43, Nov. 1976.

* cited by examiner

*Primary Examiner*—Savitri Mulpuri
(74) *Attorney, Agent, or Firm*—Venable, LLP; Robert Kinberg

(57) ABSTRACT

The present invention relates to a method for boron doping wafers using a vertical oven system. The vertical oven system (1) used comprises a vertical reaction chamber (2) that extends from an upper end toward a lower end and comprises several independently heated temperature zones (5a–5e). An upper temperature zone (5a) is provided on a gas intake (6) for a boron-containing reactive gas. The additional zones (5b–5e) follow the upper end in the direction toward the lower end of the reaction chamber (2). With this method, the boron-containing reactive gas flows over the wafers (4) inside the reaction chamber. The boron from the boron layer, deposited in this way on the wafers, subsequently diffuses into the wafer surface. The method according to the invention provides that the temperature of the additional zones (5b–5e) is adjusted such that it is possible to maintain a temperature increase during the deposit across the additional zones and a temperature drop toward the lower end of the reaction chamber (2) during the diffusion across the additional zones. A high uniformity of the produced doping profile can thus be achieved across the individual wafers as well as across the reaction chamber. The same is true for the reproducibility of the doping profile between individual process cycles.

7 Claims, 1 Drawing Sheet

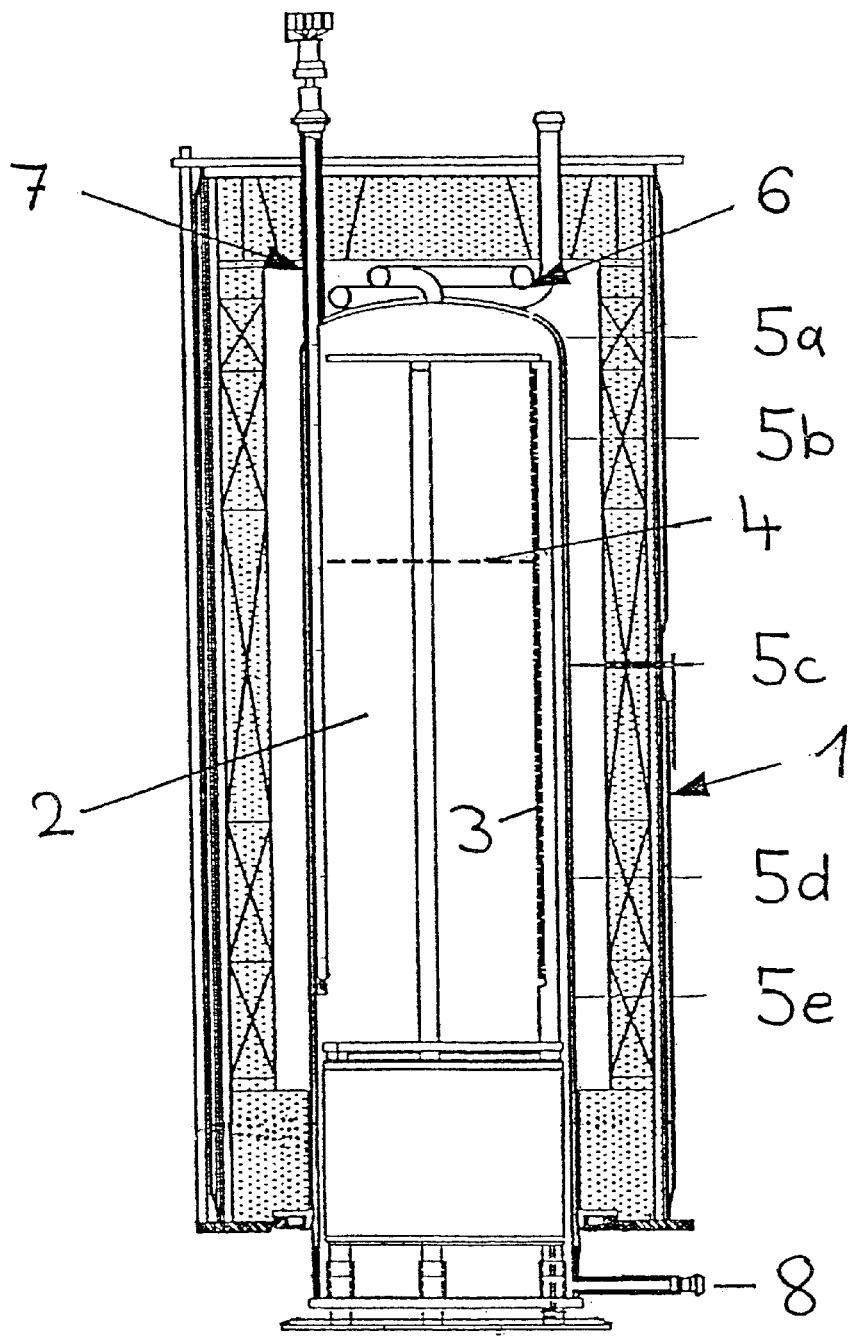

METHOD OF BORON DOPING WAFERS USING A VERTICAL OVEN SYSTEM

TECHNICAL FIELD

The present invention relates to a method for boron doping wafers using a vertical oven system. The boron doping of wafers, in particular silicon wafers, plays an important role in semiconductor technology. The present method can be used in particular for the production of semiconductor products such as power MOSFETs (metal oxide semiconductor field effect transistors) in the DMOS technology (double diffused metal oxide semiconductor technology) or for bipolar transistors.

STATE OF THE ART

Two different, technologically relevant techniques have been used so far for the boron doping of silicon wafers. One technique concerns the direct boron implantation into the silicon wafer, whereas the other technique uses source layers for diffusing the boron into the silicon wafer.

The first-mentioned boron-implanting method, for which boron ions are accelerated and impact at high speed with the silicon wafer, however, results in extremely high processing costs due to the high implantation dose required for specific applications. This method can furthermore be realized only as a single-wafer process, which increases the time expenditure and thus also the process costs. Another disadvantage of this technique is that the boron-concentration profile generated through implantation into the silicon wafer is not box-shaped, but has a Gaussian[1] shape. A second implantation is required to achieve an erfc[2] profile with this technique. However, box-shaped doping profiles in particular are needed for the aforementioned power MOSFETs and for bipolar transistors.

Thus, the second doping method mentioned herein, which makes use of source layers, is generally used for the production of doping profiles of this type at a reasonable cost. With this method, the boron doping occurs from a solid layer that is deposited on the wafer. The doping method requires a two-stage process. A thin, highly concentrated boron layer is generated in a first stage through low temperature depositing on the wafer surface. With the aid of a high-temperature diffusion process, the boron then diffuses from this thin boron layer during a second stage into the surface of the wafer, up to the desired depth.

The problem of doping uniformity and reproducibility of this doping between individual processing cycles comes becomes important as a result of the constantly increasing wafer size and the requirement for doping the highest possible number of wafers during a processing cycle. On the one hand, it must therefore be ensured that the desired doping profile on the individual wafer has the highest possible uniformity. On the other hand, the deviation in the doping profile or the doping concentration between individual wafers of a processing cycle, as well as between wafers from different processing cycles, must be negligibly small.

One variant of the method for boron doping silicon wafers from a solid layer uses boron nitride wafers as boron source for generating the source layers on the silicon wafers. A method of this type is known, for example, from J. Monkowski et al., "Solid State Technology," November 1976, pages 38 to 42. This method uses a horizontal oven system, in which the individual wafers are arranged one behind the other inside the so-called quartz boot. The boron nitride wafers are arranged for this between the individual silicon wafers.

The disadvantage of this method, however, is that the oven capacity for the silicon wafers that must actually be doped is reduced by 50% due to the required arrangement of the boron-nitride wafers. Furthermore, the danger exists that the quartz component(s) of the processing chamber is (are) contaminated or damaged because the boron-nitride wafer adheres to the quartz boot. Another disadvantage is the involved storage and conditioning of the boron-nitride wafers, which additionally are very costly and have only a limited durability.

Another method for boron doping silicon wafers from a solid layer is disclosed in the Reference P. C. Parekh et al., "Proceedings of the IEEE," Volume 57, Number 9, from Sep. 9, 1969, pages 1507 to 1512. With this method, liquid $BBr_3$ (boron tribromide) is used as a source. Oxygen and $BBr_3$ are fed jointly with nitrogen as carrier gas into the reaction room containing the wafers. Inside the reaction room, the $BBr_3$ together with the oxygen forms the so-called reactive gas, which reacts as follows:

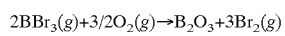

The borosilicate glass is thus deposited on the surface of the wafer. The borosilicate glass created in this way functions as source layer, from which boron is diffused during the subsequent diffusion phase (drive in) into the wafer substrate underneath. A horizontal oven system with an expanded, constant temperature zone was used for this method. The borosilicate glass is deposited at a temperature range between 860 and 950° C., the diffusion occurs at 1220° C. The problem of a uniform doping was again of the utmost importance.

One disadvantage of the method shown herein is that the doping uniformity again could not be maintained, in particular over the length of the horizontal oven used.

Furthermore, larger wafer diameters cannot necessarily be processed automatically when using a horizontal oven system. Thus, maximum 5-inch wafer diameters can presently be doped inside horizontal oven systems. A change from the 5-inch wafer to the 6-inch wafer is possible only with great difficulties because of the required change in the processing specifications with respect to the doping uniformity of the silicon wafer.

Starting with this state of the technology, it is the object of the invention to specify a method for boron doping wafers, which makes it possible to achieve a high doping uniformity without requiring structural changes in the existing oven systems when changing from smaller to larger wafer diameters. In addition, a cost-effective realization of this method should be possible.

ILLUSTRATION OF THE INVENTION

This object is solved with the method according to claim 1. Advantageous embodiments of the method are the subject matter of the dependent claims.

A vertical diffusion oven is used with the method according to the invention for boron doping wafers. This oven is provided with a vertical reaction chamber, extending from an upper end toward a lower end, which comprises several independently heated temperature zones. A gas intake for a boron-containing reactive gas is located at the upper end of the reaction chamber. The individual temperature zones extend successively from the upper end toward the lower end of the reaction chamber. With the method according to the invention, the boron-containing reactive gas flows over the wafers arranged inside the reaction chamber to deposit a layer of boron, in particular a layer of borosilicate glass. Subsequently, the boron from the boron layer is diffused into the surface of the wafer. According to the invention, the temperature in the independently heated temperature zones is adjusted such that between the zone following the top temperature zone and the lowest temperature zone, a temperature increase is maintained during the deposit of the boron layer and a temperature drop is maintained during the subsequent diffusion.

Inside the reaction chamber of the vertical oven, these additional temperature zones extend over the region filled with wafers. The upper zone covers the region of the gas intake. The temperature increase or the temperature drop toward the lower end of the reaction chamber is initiated through a stage-by-stage increase or reduction in the temperature from zone to zone. Excellent results can be obtained with a vertical diffusion oven that is divided into five temperature zones, wherein the middle temperature zone extends over approximately half the height of the reaction chamber. The boron-containing reactive gas can be provided through different, liquid or gas-containing boron sources. Examples for these are $BBr_3$, $BCl_3$ or $B_2H_6$ sources.

The method according to the invention on the one hand differs from the aforementioned methods in that a vertical oven is used and, on the other hand, in that different temperature zones with different temperatures are maintained during the depositing and the diffusion processes.

With the method according to the invention and using the vertical oven system, it is possible to transfer a boron doping process from silicon wafers with a maximum diameter of 5 inches, which is standard for the aforementioned prior art, to 6 inches without requiring involved structural changes on the diffusion oven. The method makes it possible to achieve an improved doping uniformity, in particular relative to the aforementioned methods, with respect to the uniformity of the layer resistance across the wafer as well as across the total reaction chamber or the length of the quartz boot used. The reproducibility of the results from process cycle to process cycle is furthermore excellent.

The method according to the invention avoids the use as well as the maintenance of expensive boron nitride source wafers and permits the doping of a silicon substrate with high-concentration boron in the range above $1\times10^{19}$ $cm^{-3}$ on the wafer surface. The dopant in this case has a box-shaped concentration profile that is approximately described with an erfc function. As a result, a stable and economic doping process is available for the special requirements of power MOS and bipolar semiconductor processes with respect to the form of the boron concentration profile.

The temperatures for depositing the boron layer are preferably selected from the range between 800° C. and 950° C. and those for the diffusion from the temperature range between 1020° C. and 1050° C. Good results are obtained in particular if the temperature in the upper zone for the deposit as well as the diffusion is selected higher than the temperature of the respectively following temperature zone. This temperature of the upper temperature zone influences the temperature of the reactive gas that flows in through the gas intake.

The reactive gas is preferably made available via a $BBr_3$ bottle ($BBr_3$ bubbler) by mixing it with oxygen.

When using a vertical diffusion oven with at least five temperature zones, excellent results can be achieved with the method according to the invention if the temperatures for depositing the boron layer from the upper to the lowest zone are set to 860° C., 845° C., 860° C., 890° C. and 900° C., respectively with an accuracy of ±5° C., and for the diffusion to 1042° C., 1037° C., 1035° C., 1027.5° C. and 1025° C., respectively with an accuracy of ±0.5° C. These temperature settings result in a high uniformity of the introduced doping profiles.

When using a mixture of oxygen and $BBr_3$ as reactive gas and nitrogen as carrier gas, particularly advantageous results can be achieved, given a reaction chamber volume of 50±5 liters, with gas flows of 10 slm±0.5 slm for the carrier gas, 0.1 slm±0.01 slm for the oxygen and 0.1 slm±0.01 slm for the $BBr_3$. The person skilled in the art can adapt these values to a reaction chamber with a different volume.

Ways to Realize the Invention

The invention is explained once more in the following with the aid of an exemplary embodiment and in connection with the drawing, without restricting the general inventive idea.

The single FIGURE in this case schematically shows the design of a vertical diffusion oven 1 with a vertically extending reaction chamber 2. The reaction chamber 2 contains the quartz boot 3 with the wafers. Only one wafer 4 is shown herein as exemplary embodiment. The gas intake 6 for the reactive gas is located at the upper end of the reaction chamber 2. A gas outlet 8 for the gas that is flowing through is located at the lower end. The reference number 7 relates to a 5-part thermal element for detecting the temperatures in the 5 temperature zones during the process. The Figure shows the aforementioned five temperature zones 5a to 5e. The upper temperature zone 5a essentially influences the gas intake 6 for the reactive gas, while the additional temperature zones 5b to 5e cover the region in which the wafers 4 are arranged. A vertical oven of this type can be obtained commercially.

For the following example, the silicon wafers are to be provided with a box-shaped boron concentration profile and a surface concentration of $>3\times10^{19}$ $cm^{-3}$. The target layer resistance is to be approximately 20.5 Ohm/square and can be adjusted in the range of 17.5–23.5 Ohm/Sq. The resistance layer variations in this case is to be at maximum 2 Ohm/Sq across the wafers, at maximum 1 Ohm/Sq across the boot and at maximum 1 Ohm/Sq from operation to operation. The depth of the p/n junction is to be 0.9 µm.

To achieve these predetermined values, the vertical oven system 1 shown in FIG. 1, with the five independently heated temperature zones 5a to 5e, is used without further modification at the gas intake 6 or any other parts. A $BBr_3$ bubbler, which is not shown in the figure, is used for providing the reactive gas. The reaction chamber 2 of this oven has a volume of approximately 50 liters.

The gas flows for the nitrogen gas ($N_2$ carrier) and the oxygen gas ($O_2$ and $BBr_3$) as well as the temperature of the individual heating zones were adjusted within the parameter range defined by the marginal conditions during the deposition and the diffusion to achieve these predetermined values.

During the process, oxygen and $BBr_3$ together with nitrogen as carrier gas are fed at approximately 900° C. into the reaction chamber 2. Since $BBr_3$ is present in liquid form at room temperature, the so-called bubbler principle for introducing the chemical into the reaction chamber is used for the present example. In the process, nitrogen flows through a quartz vessel filled with liquid $BBr_3$. The nitrogen carries $BBr_3$ liquid along into the reaction chamber 2. The carrier gas is intended to make available across the complete reaction chamber amounts of reactive gases that are as uniform as possible, meaning oxygen and $BBr_3$ in the present case. As a result of the reaction described in the introductory section to the specifications, borosilicate glass is deposited as a source layer on the wafers 4 inside the reaction chamber 2.

The parameters adjusted for reaching the predetermined gas flow values (measured in slm=liter/minute under standard conditions) are:

N₂ carrier: 10 slm±0.5 slm
O₂: 0.1 slm±0.01 slm
BBr₃: 0.1 slm±0.01 slm.

During the deposition, the temperature for the heating zones was adjusted as follows with an accuracy of ±5° C.:

| zone 1 (5a; at the gas intake): | 860° C. |
|---|---|
| zone 2 (5b): | 845° C. |
| zone 3 (5c): | 860° C. |
| zone 4 (5d): | 890° C. |
| zone 5 (5e): | 900° C. |

The time required for deposition was 45 minutes.

Following the deposition of the borosilicate glass layer and taking into account the above-mentioned process parameters, the boron diffuses from this layer into the silicon substrate underneath, in dependence on time and temperature. In the process, a specific concentration profile adjusts in dependence on time and temperature, which in turn results in a specific layer resistance value. A box-shaped boron concentration profile results since the deposited borosilicate glass represents a so-called "endless" source. In order to obtain the predetermined values used for this example, the temperature for the heating zones is adjusted during the drive-in with an accuracy of ±0.5° C. as follows:

| zone 1 (5a; at the gas intake): | 1042° C. |
|---|---|
| zone 2 (5b): | 1037° C. |
| zone 3 (5c): | 1035° C. |
| zone 4 (5d): | 1027.5° C. |
| zone 5 (5e): | 1025° C. |

Following this diffusion process, the borosilicate glass is etched off the wafer surface, so that a boron-doped silicon wafer with the aforementioned values is available for subsequent processes.

For this example, 6-inch silicon wafers were used. The quartz boot 3 inside the reaction chamber 2 was provided with a full load of 125 wafers 4, of which 3 served as test wafers, located in the positions 110, 65 and 11. The position 125 was located next to the gas intake 6. Following completion of the process, the borosilicate glass was removed with hydrofluoric acid (HF) from the test wafers. The layer resistance of the test wafers was then determined with a commercially available measuring instrument using a 4-point measuring method, on a total of 115 positions distributed across the wafer. The following values resulted:

| | layer resistance (Ohm/square) | | |
|---|---|---|---|
| wafer position | minimum | maximum | difference across the wafer |
| 110 | 19.2 | 20.5 | 1.4 |
| 65 | 19.8 | 20.9 | 1.3 |
| 11 | 19.7 | 20.7 | 1.0 |

Based on these values, a maximum layer resistance variation of 1.4 Ohm/Sq resulted for the uniformity across the wafer and a maximum layer resistance variation of 0.14 Ohm/Sq for the uniformity across the boot. Additional process cycles with the same type of experimental arrangement, using the same parameters, resulted in a uniformity of the layer resistance from operation to operation of better than 0.5 Ohm/Sq. The shape of the boron concentration profile as well as the achieved depth of the p/n junction were determined with a commercially available measuring instrument by means of the spreading resistance technique. A value of 0.9 μm was obtained for the junction depth. The surface concentration amounted to approximately $6 \times 10^{19}$ cm$^{-3}$ and is thus within the required range. The measured values show that it is easy to observe the predetermined values when using the method according to the invention.

With the method according to the invention, it is possible to achieve a uniform deposit, based on the specified values, inside the reaction chamber across the individual wafer as well as from operation to operation. A batch process can be realized with this method, with full use of the oven-specific load capacity. The method does not require a source wafer and gets by on a low chemical use, so that an extremely economical boron doping can be realized. The use of the vertical oven system provides unlimited possibilities for the automatic handling, meaning in particular the loading and unloading of the silicon wafers with robots, without special wafer tilting capability of the robots used. An on the whole cost-effective method is provided, which ensures a non-problematic changeover from the 5-inch to the 6-inch wafer and an extremely high uniformity and reproducibility of the doping profile.

| Reference Number List | |
|---|---|
| 1 | vertical oven |
| 2 | reaction chamber |
| 3 | quartz boot |
| 4 | wafer |
| 5a | first or upper heating zone |
| 5b | second heating zone |
| 5c | third heating zone |
| 5d | fourth heating zone |
| 5e | fifth heating zone |
| 6 | gas intake 1 |
| 7 | thermal element |
| 8 | gas outlet |

What is claimed is:

1. A method for boron doping wafers using a vertical oven system (1) with a vertical reaction chamber (2) that extends from an upper end toward a lower end and comprises several independently heated temperature zones (5a–e), of which an upper zone (5a) is provided on a gas intake (6) for a boron-containing reactive gas and the remaining zones (5b–e) follow in the direction of the lower end of the reaction chamber, which method calls for the boron-containing reactive gas to flow over the wafers (4) positioned inside the reaction chamber (2) in order to deposit a layer of boron on the wafers (4) and the boron to be diffused from the boron layer into the surface of the wafer (4), wherein the temperature of the additional zones (5b–e) is adjusted such that during the depositing of the boron layer across the additional zones, a temperature increase is maintained and during the diffusion across the additional zones a temperature drop is maintained toward the end of the reaction chamber (2).

2. A method according to claim 1, characterized in that the temperature for depositing the boron layer in the additional zones (5b–e) is selected from the temperature range between 800° C. and 950° C. and for the diffusion from the temperature range between 1020° C. and 1050° C.

3. A method according to claim 1 or 2, characterized in that
   a higher temperature is adjusted for the upper zone (5*a*) during the deposit as well as during the diffusion than in the following zone (5*b*) of the additional zones.

4. A method according to one of the claims 1 to 3, characterized in that
   a vertical oven system with at least 5 temperature zones is used.

5. A method according to claim 4, characterized in that
   during the deposit of the boron layer, the temperature for the upper zone is adjusted to 860° C.±5° C.
   and the temperature for the additional 4 zones (5*b–e*) toward the lower end of the reaction chamber (2) is respectively adjusted to 845° C.±5° C., 860° C.±5° C., 890° C.±5° C. and 900° C.±5° C.
   and that the temperature of the upper zone is adjusted during the diffusion to 1042° C.±0.5° C. while the temperatures of the additional 4 zones (5*b–e*) toward the lower end of the reaction chamber (2) are respectively adjusted to 1037° C.±0.5° C., 1035° C.±0.5° C., 1027.5° C.±0.5° C. and 1025±0.5° C.

6. A method according to one of the claims 1 to 5, characterized in that
   the boron-containing reactive gas is made available through a $BBr_3$ bubbler.

7. A method according to one of the claims 1 to 6, characterized in that
   the boron-containing reactive gas is composed of oxygen and $BBr_3$, which is fed together with nitrogen as carrier gas into the reaction chamber (2), wherein for a reaction chamber (2) volume of 45 to 55 liters, a gas flow of 10 slm±0.5 slm is adjusted for the carrier gas, of 0.1 slm±0.01 slm for the oxygen and of 0.1 slm±0.01 slm for the $BBr_3$.

* * * * *